United States Patent
Kim et al.

(10) Patent No.: US 10,855,290 B1
(45) Date of Patent: Dec. 1, 2020

(54) DELAY LOCKED LOOP

(71) Applicants: SK hynix Inc., Icheon (KR); KOREA UNIVERSITY RESEARCH AND BUSINESS FOUNDATION, Seoul (KR)

(72) Inventors: Chul Woo Kim, Seoul (KR); Hyun Su Park, Seoul (KR)

(73) Assignees: SK hynix Inc., Icheon (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/703,748

(22) Filed: Dec. 4, 2019

(30) Foreign Application Priority Data

May 17, 2019 (KR) .................... 10-2019-0058006

(51) Int. Cl.
- *H03L 7/06* (2006.01)
- *H03L 7/081* (2006.01)
- *H03L 7/085* (2006.01)

(52) U.S. Cl.
CPC ............ *H03L 7/0812* (2013.01); *H03L 7/085* (2013.01)

(58) Field of Classification Search
CPC ............................. H03L 7/0812; H03L 7/085
USPC .......................................................... 327/158
See application file for complete search history.

(56) References Cited

U.S. PATENT DOCUMENTS

| 2006/0140024 A1* | 6/2006 | Lee ...................... G11C 7/1072 |
| | | 365/194 |
| 2007/0176656 A1* | 8/2007 | Lesso .................... H03L 7/0812 |
| | | 327/158 |

FOREIGN PATENT DOCUMENTS

| KR | 100884589 B1 | 2/2009 |
| KR | 20140072423 A | 6/2014 |

\* cited by examiner

*Primary Examiner* — Metasebia T Retebo

(57) ABSTRACT

Embodiments disclose a delay locked loop. The delay locked loop including a main delay circuit configured to generate initial clocks by delaying an internal clock, and sub-delay lines configured to generate phase clocks having a phase difference corresponding to a desired initial delay by respectively delaying the internal clock and the initial clocks. The phase difference among the phase clocks may be adjusted according to delay values of the sub-delay lines.

9 Claims, 2 Drawing Sheets

DELAY LOCKED LOOP

CROSS-REFERENCE TO RELATED APPLICATION

This application claims priority under 35 U.S.C. § 119 to Korean Patent Application No. 10-2019-0058006 filed on May 17, 2019, which is incorporated herein by reference in its entirety.

BACKGROUND

1. Field

Exemplary embodiments relate to a semiconductor device, and more particularly, to a delay locked loop suitable for use in a semiconductor device operating at a high speed.

2. Discussion of the Related Art

A semiconductor device may use a delay locked loop to compensate for time delays caused by internal circuits when an external clock is used internally.

The delay locked loop generates multi-phase clocks by delaying an internal clock, compares a phase difference between the internal clock and a feedback clock, and performs a locking operation by adjusting a delay value on the basis of a result of the comparison. The delay value is the delay between successive phase clocks generated by the delay locked loop. However, an initial value of the delay value of the delay locked loop may limit an operating frequency of the semiconductor device.

For example, a delay locked loop which generates four phase clocks from an internal clock needs to have a delay value corresponding to a phase difference of 90° of the internal clock.

However, the delay locked loop according to the related art has a problem that the four phases will not be aligned within one cycle of the internal clock when the initial value of the delay value corresponds to a phase difference larger than 90° of the internal clock.

Such a problem of the initial value of the delay value may limit the overall operating speed of the semiconductor device operating at a high speed.

SUMMARY

Various embodiments are directed to a delay locked loop by which it is possible to design a semiconductor device operating at a high speed by solving a problem of initial delay that limits an operating frequency of a semiconductor device.

In an embodiment, there is provided a delay locked loop including: a main delay circuit configured to generate a plurality of initial clocks by delaying an internal clock; and a plurality of sub-delay lines configured to generate a plurality of phase clocks having a phase difference corresponding to a desired initial delay by respectively delaying the internal clock and the initial clocks, wherein the phase difference among the phase clocks is adjusted according to delay values of the sub-delay lines.

In an embodiment, there is provided a delay locked loop including: a main delay circuit configured to generate first, second, third, and fourth initial clocks by delaying an internal clock; and a sub-delay circuit configured to generate first, second, third, and fourth phase clocks having a phase difference according to a desired initial delay by respectively delaying the internal clock and the first to third initial clocks by first, second, third, and fourth delay values, wherein the first to fourth delay values are used to adjust the phase difference according to the initial delay.

According to the embodiments, the delay locked loop can adjust the phase difference among the phase clocks due to the initial delay by using the delay values of the sub-delay lines, so that it is possible to generate phase clocks satisfying a condition that the phase difference is smaller than a value obtained by dividing one cycle of the internal clock by the number of phase clocks.

Furthermore, the delay locked loop eliminates the limitations of the initial delay and can generate the phase clocks that guarantee an operation at a desired frequency, so that it is possible to design a high speed semiconductor device without frequency limitation.

DETAILED DESCRIPTION

Figure 1:
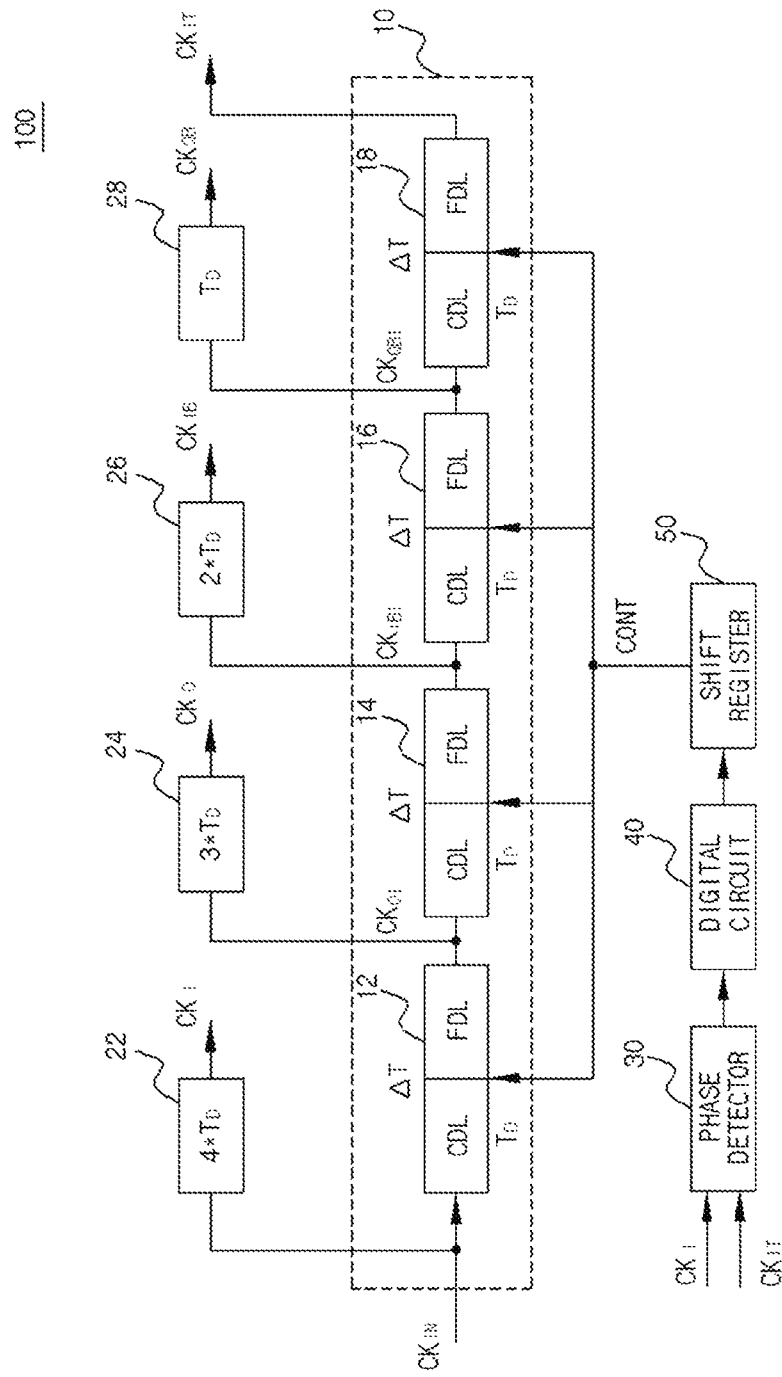
FIG. 1 illustrates a delay locked loop in accordance with an embodiment.

Various embodiments will be described below in more detail with reference to the accompanying drawings such that the present invention can be easily embodied by those skilled in the art to which the present invention pertains. Throughout the disclosure, like reference numerals refer to like parts throughout the various figures and embodiments of the present invention.

Moreover, detailed descriptions related to well-known functions or configurations will be omitted in order not to unnecessarily obscure subject matters of the present invention.

The terms such as first and second may be used to describe various components, but the components are not limited by the terms, and the terms are used only to distinguish one component from another component.

The present embodiments provide a delay locked loop capable of solving a problem of initial delay that limits an operating frequency of a semiconductor device.

Although the present embodiments exemplify that four phase clocks are generated, this is for illustrative purposes only and various modifications and equivalent other embodiments can be made from the embodiments.

FIG. 1 illustrates a delay locked loop 100 in accordance with an embodiment.

The delay locked loop 100 includes a main delay circuit 10, sub-delay lines 22, 24, 26, and 28, a phase detector 30, a digital circuit 40, and a shift register 50.

The main delay circuit 10 receives an internal clock $CK_{IN}$ and generates initial clocks $CK_{Q1}$, $CK_{IB1}$, $CK_{QB1}$, and $CK_{IT}$ by delaying the internal clock $CK_{IN}$.

Such a main delay circuit 10 includes unit delay lines 12, 14, 16, and 18 serially connected to one another, and the unit delay lines 12, 14, 16, and 18 have the same initial delay value. The initial delay value may be defined as a delay value corresponding to a phase difference before aligning the phases of the initial clocks $CK_{Q1}$, $CK_{IB1}$, $CK_{QB1}$, and $CK_{IT}$. For example, the initial delay value may be set to the smallest delay value that the unit delay lines 12, 14, 16, and 18 are capable of providing.

The first unit delay line 12 generates the first initial clock $CK_{Q1}$ by delaying the internal clock $CK_{IN}$, the second unit delay line 14 generates the second initial clock $CK_{IB1}$ by delaying the second initial clock $CK_{Q1}$, the third unit delay line 16 generates the third initial clock $CK_{QB1}$ by delaying the second initial clock $CK_{IB1}$, and the fourth unit delay line 18 generates the fourth initial clock $CK_{IT}$ by delaying the third initial clock $CK_{QB1}$.

A delay time of the unit delay lines 12, 14, 16, and 18 may be determined by a control signal CONT. The delay time of each of the unit delay lines 12, 14, 16, and 18 may have an initial delay value $\Delta T$ which is greater than zero. An initial phase difference among the initial clocks $CK_{Q1}$, $CK_{IB1}$, $CK_{QB1}$, and $CK_{IT}$ generated by the unit delay lines 12, 14, 16, and 18 may correspond to the initial delay value $\Delta T$ of each of the unit delay lines 12, 14, 16, and 18. In embodiments, each of the unit delay lines 12, 14, 16, and 18 are identical in design, and therefore have a same initial delay value $\Delta T$, and for values of the control signal CONT respectively produce corresponding equal delay times. In embodiments, each of the unit delay lines 12, 14, 16, and 18 receive a same value of the control signal CONT.

A sub-delay circuit includes the sub-delay lines 22, 24, 26, and 28, and the sub-delay lines 22, 24, 26, and 28 generate phase clocks $CK_I$, $CK_Q$, $CK_{IB}$, and $CK_{QB}$ by delaying the internal clock $CK_{IN}$ and the initial clocks $CK_{Q1}$, $CK_{IB1}$, and $CK_{QB1}$, respectively.

Among the sub-delay lines 22, 24, 26, and 28, the first sub-delay line 22 generates the phase clock $CK_I$ by delaying the internal clock $CK_{IN}$, the second sub-delay line 24 generates the phase clock $CK_Q$ by delaying the first initial clock $CK_{Q1}$, the third sub-delay line 26 generates the phase clock $CK_{IB}$ by delaying the second initial clock $CK_{IB1}$, and the fourth sub-delay line 28 generates the phase clock $CK_{QB}$ by delaying the third initial clock $CK_{QB1}$.

The delay values of the sub-delay lines 22, 24, 26, and 28 may be used to adjust an initial phase difference among phase clocks $CK_I$, $CK_Q$, $CK_{IB}$, and $CK_{QB}$, that is, a phase difference due to the initial delay value of the components of the delay locked loop 100. The delay values of the sub-delay lines 22, 24, 26, and 28 may be configured to provide a phase difference between the phase clocks $CK_I$, $CK_Q$, $CK_{IB}$, and $CK_{QB}$ that is less than a phase difference between the internal clock $CK_{IN}$ and the initial clocks $CK_{Q1}$, $CK_{IB1}$, $CK_{QB1}$, and $CK_{IT}$.

For example, the delay locked loop 100 may adjust the delay values of the sub-delay lines 22, 24, 26, and 28 and set the phase difference to be smaller than a value obtained by dividing one cycle of the internal clock $CK_{IN}$ by the number of phase clocks $CK_I$, $CK_Q$, $CK_{IB}$, and $CK_{QB}$.

Such a delay locked loop 100 may be applied to design a semiconductor device using a high frequency.

As described above, the delay locked loop 100 can adjust the initial phase difference caused by the initial delay values using the delay values of the sub-delay lines 22, 24, 26, and 28, so that it is possible to align the phases of the clocks within one cycle of the internal clock $CK_{IN}$ during a locking operation.

More specifically, the main delay circuit 10 includes the unit delay lines 12, 14, 16, and 18 serially connected to one another, and each of the unit delay lines 12, 14, 16, and 18 includes a coarse delay line (CDL) and a fine delay line (FDL). The respective propagation delays introduced by the coarse delay line (CDL) and the fine delay line (FDL) may be determined according to respective portions of the control signal CONT, and the total propagation delay through the unit delay lines 12, 14, 16, and 18 may be equal to the sum of the propagation delays of the coarse delay line (CDL) and the fine delay line (FDL). In an embodiment, an initial delay time $\Delta T$ of each of the unit delay lines 12, 14, 16, and 18 may be greater than a initial propagation delay of the respective coarse delay line (CDL). In embodiments, the coarse delay line (CDL) and the fine delay line (FDL) may be designed based on a NAND gate.

Furthermore, the delay values of the sub-delay lines 22, 24, 26, and 28 may be set to decrease from N times the initial delay value of the coarse delay line (CDL) in the sequence of the phase clocks $CK_I$, $CK_Q$, $CK_{IB}$, and $CK_{QB}$ in which the respective phase difference increase relative to the internal clock $CK_{IN}$.

For example, when the initial delay value of the coarse delay line (CDL) is $T_D$, the delay value of the first sub-delay line 22 which generates the phase clock $CK_I$ may be set to $4N*T_D$, the delay value of the second sub-delay line 24 which generates the phase clocks $CK_Q$ may be set to $3N*T_D$, the delay value of the third sub-delay line 26 which generates the phase clock $CK_{IB}$ may be set to $2N*T_D$, and the delay value of the fourth sub-delay line 28 which generates the phase clock $CK_{QB}$ may be set to $N*T_D$. In an embodiment, N is an integer. In embodiments, N may be 1.

When the initial delay value of each of the unit delay lines 12, 14, 16, and 18 is $\Delta T$, the initial delay value of the coarse delay line (CDL) is $T_D$, the first, second, third, and fourth sub-delay lines 22, 24, 26, and 28 are configured to have respective delays of $4T_D$, $3T_D$, $2T_D$, and $1T_D$ (as described above when N is defined as 1), the phase difference due to the initial delay among the phase clocks $CK_I$, $CK_Q$, $CK_{IB}$, $CK_{QB}$, and $CK_{IT}$ may be calculated by Equation 1 below.

$$\left. \begin{array}{l} CK_I = CK_{IN} \text{ delayed by } 4T_D \\ CK_Q = CK_{IN} \text{ delayed by } \Delta T + 3T_D \\ CK_{IB} = CK_{IN} \text{ delayed by } 2\Delta T + 2T_D \\ CK_{QB} = CK_{IN} \text{ delayed by } 3\Delta T + T_D \\ CK_{IT} = CK_{IN} \text{ delayed by } 4\Delta T \end{array} \right| \begin{array}{l} \text{difference} = \Delta T - T_D \\ \text{difference} = \Delta T - T_D \\ \text{difference} = \Delta T - T_D \\ \text{difference} = \Delta T - T_D \end{array} \quad \text{Equation 1}$$

As described above, the phase difference due to the initial delay between the phase clock $CK_I$ and the phase clock $CK_Q$ may be defined as $\Delta T - T_D$, and the phase difference due to the initial delay between the phase clock $CK_Q$ and the phase clock $CK_{IB}$, between the phase clock $CK_{IB}$ and the phase clock $CK_{QB}$, and between the phase clock $CK_{QB}$ and the phase clock $CK_{IT}$ may also be defined as $\Delta T - T_D$. Thus, in contrast to a delay locked loop of the related arts, the phase difference between each phase clock of the delay locked loop 100 may be less than the initial delay value $\Delta T$ of the unit delay lines that make up a main delay circuit 10 of the digital locked loop 100.

That is, since the delay locked loop 100 in accordance with the embodiment may adjust the initial delay between each of the phase clocks to equal $\Delta T - N*T_D$, the effective initial delay value may be decreased as the value of N increases and may be set to 0 or a negative value.

Consequently, the delay locked loop 100 in accordance with the embodiment can be designed with less limitation on a frequency range and can be applied to design a semiconductor device requiring an operation at a high frequency.

Meanwhile, the delay locked loop 100 may include a clock buffer (not illustrated) that buffers an external clock to provide the internal clock $CK_{IN}$ to the main delay circuit 10.

Furthermore, the delay locked loop 100 may further include the phase detector 30 that detects the phase difference between the phase clock $CK_I$ and the phase clock $CK_{IT}$, the digital circuit 40 that generates a code signal for adjusting the delay value of the main delay circuit on the basis of the phase difference, and the shift register 50 that provides the main delay circuit 10 with a control signal corresponding to the code signal, but embodiments are not limited thereto.

In the present document, a detailed description of a general operation of the delay locked loop 100, for example, an operation, in which the delay locked loop 100 compares the phase difference between the phase clock $CK_I$ and the phase clock $CK_{IT}$, and performs a locking operation by adjusting the delay values of the unit delay lines 12, 14, 16, and 18 on the basis of a result of the comparison will be omitted in the interest of not obscuring the invention. In an embodiment, the delays provided by the sub-delay lines 22, 24, 26 are not altered during the locking operation, but may be set according to a predetermined mode, as described with respect to FIGS. 2-4.

More generally, when the delay value of each of the unit delay lines 12, 14, 16, and 18 is controlled using the control signal CONT to be $\Delta T+x$, wherein x depends on the value of the control signal CONT, and the first, second, third, and fourth sub-delay lines 22, 24, 26, and 28 are configured to have respective delays of $4T_D$, $3T_D$, $2T_D$, and $1T_D$ the phase difference among the phase clocks $CK_I$, $CK_Q$, $CK_{IB}$, $CK_{QB}$, and $CK_{IT}$ may be calculated by Equation 2 below.

$$\left. \begin{array}{l} CK_I = CK_{IN} \text{ delayed by} \\ \quad 4T_D \\ CK_Q = CK_{IN} \text{ delayed by} \\ \quad \Delta T + x + 3T_D \\ CK_{IB} = CK_{IN} \text{ delayed by} \\ \quad 2(\Delta T + x) + 2T_D \\ CK_{QB} = CK_{IN} \text{ delayed by} \\ \quad 3(\Delta T + x) + T_D \\ CK_{IT} = CK_{IN} \text{ delayed by} \\ \quad 4(\Delta T + x) \end{array} \right\} \begin{array}{l} \text{diff.} = (\Delta T - T_D) + x \\ \\ \text{diff.} = (\Delta T - T_D) + x \\ \\ \text{diff.} = (\Delta T - T_D) + x \\ \\ \text{diff.} = (\Delta T - T_D) + x \end{array} \quad \text{Equation 2}$$

Accordingly, the delay locked loop of the example operates with an effective initial delay time $(\Delta T - T_D)$ for the unit delay lines 12, 14, 16, and 18 that is smaller than the actual initial delay time $\Delta T$ for the unit delay lines 12, 14, 16, and 18, and therefore may operate properly (that is, achieve lock) at frequencies of the internal clock $CK_{IN}$ higher than the unit delay lines 12, 14, 16, and 18 would allow in a delay locked loop of the related arts.

Figure 2:
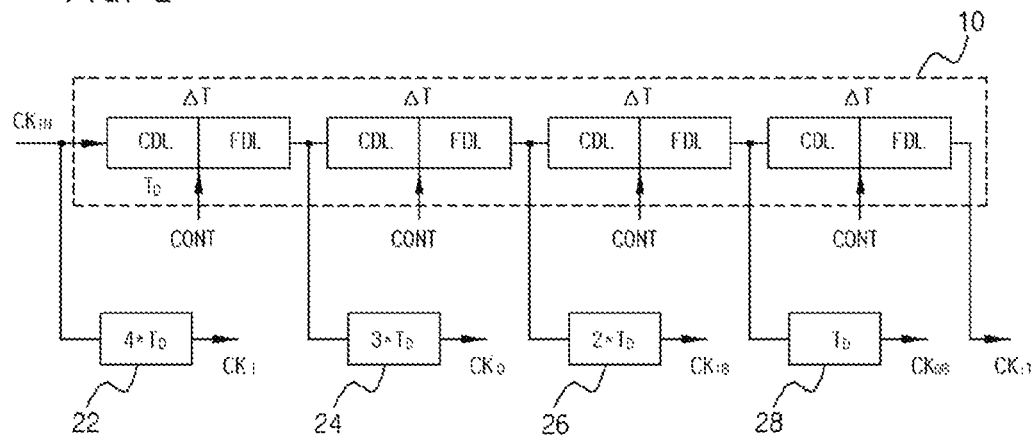
FIG. 2 illustrates a delay locked loop in accordance with an embodiment utilized according to a first operation mode.
Figure 3:
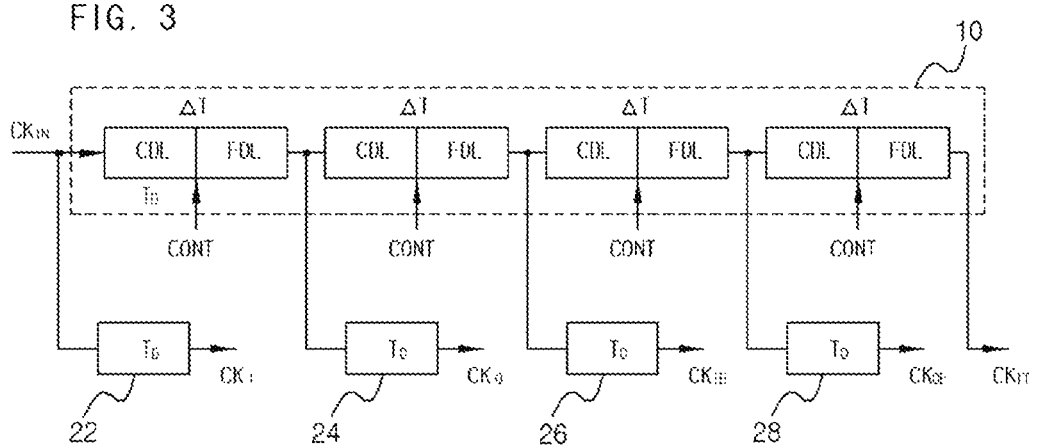
FIG. 3 illustrates a delay locked loop in accordance with an embodiment utilized according to a second operation mode.
Figure 4:
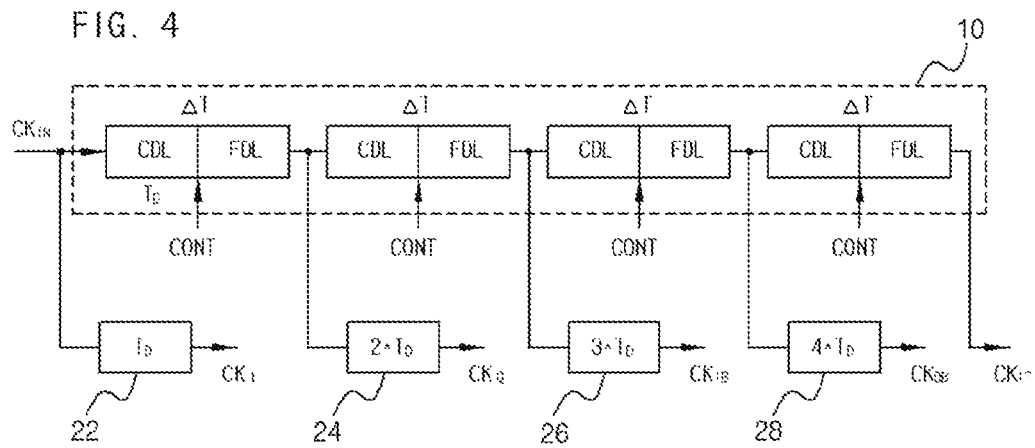
FIG. 4 illustrates a delay locked loop in accordance with an embodiment utilized according to a third operation mode.

FIG. 2, FIG. 3, and FIG. 4 respectively illustrate the delay locked loop according to an embodiment utilized according to three illustrative operation modes.

The delay locked loop 100 may be used in the three modes for reasons other than improving an effective initial delay. For example, in some modes the delay values of the sub-delay lines 22, 24, 26, and 28 may be differently set in order to determine the speed of a semiconductor device, while in other modes those delay values may be set to provide lower power operation of a semiconductor device.

In a first mode illustrated in FIG. 2, the delay locked loop 100 may use be configured to support a frequency range for high speed operation.

The respective delay values of the sub-delay lines 22, 24, 26, and 28 of the delay locked loop may be set to decrease by a predetermined value in a same sequence as the phase clocks $CK_I$, $CK_Q$, $CK_{IB}$, and $CK_{QB}$ increase in phase difference relative to the internal clock $CK_{IN}$ in the high speed mode.

For example, the delay values of the sub-delay lines 22, 24, 26, and 28 may be respectively set as $4T_D$, $3T_D$, $2T_D$, and $T_D$, or as $8T_D$, $6T_D$, $4T_D$, and $2T_D$, or for any value K as $4KT_D$, $3KT_D$, $KT_D$, and $KT_D$, according to the target value of the initial delay of the delay locked loop 100. As described above, the delay locked loop may decrease an effective initial delay value of the unit delay lines 12, 14, 16, and 18 to a desired value by setting the delay values of the sub-delay lines 22, 24, 26, and 28 as $4T_D$, $3T_D$, $2T_D$, and $T_D$, or as $8T_D$, $6T_D$, $4T_D$, and $2T_D$, and so on, according to the target value of the initial delay.

In a second (normal) mode illustrated in FIG. 3, the delay locked loop 100 may be configured for a normal mode providing a low power operation and a lower frequency than the first mode.

When operating in the normal mode providing other than the high speed operation, it is not necessary to improve the initial delay. Therefore the delay values of the sub-delay lines 22, 24, 26, and 28 may each be set as an initial value $T_D$. In such a case, since the delay value is minimized, power dissipated by the circuit may be reduced.

In a third mode illustrated in FIG. 4, the delay locked loop 100 may be configured for low speed operation.

In the third mode, the delay values of the sub-delay lines 22, 24, 26, and 28 may be set to increase sequentially by a predetermined value in the sequence that the phase clocks $CK_I$, $CK_Q$, $CK_{IB}$, and $CK_{QB}$ increase in phase difference relative to the internal clock $CK_{IN}$. For example, the delay values of the sub-delay lines 22, 24, 26, and 28 may be respectively set as $T_D$, $2T_D$, $3T_D$, and $4T_D$, or $2T_D$, $4T_D$, $6T_D$, and $8T_D$, or for any value K as $KT_D$, $2KT_D$, $3KT_D$, and $4KT_D$. Accordingly, the frequency range in which the delay locked loop operates can be extended to a low speed region beyond that which would be possible using just the delays that the unit delay lines 12, 14, 16, and 18 are capable of providing, and the maximum range of the delay of the delay locked loop can increase.

According to the aforementioned embodiments, by appropriate configuration of the delay values of the sub-delay lines, the delay locked loop 100 can adjust the phase difference among the phase clocks produced thereby over a wider range than a main delay circuit of the delay locked loop 100 is capable of providing, so that it is possible to generate phase clocks having a phase difference smaller than an initial delay provided by unit delay lines of the main delay circuit. More generally, given a range of delay times that may be provided by the unit delay lines in response to a control signal, embodiments may provide, by appropriate configuration of the delays of the sub-delay lines, a plurality of phase clocks having phase differences ranging from shorter than an initial delay that may be provided by the unit delay lines to longer than a maximum delay that may be provided by the unit delay lines.

Furthermore, the delay locked loop 100 reduces the limitations imposed by the initial delay of the main delay circuit, and can generate the phase clocks $CK_I$, $CK_Q$, $CK_{IB}$, and $CK_{QB}$ that guarantee an operation at a desired frequency higher than a delay locked loop of the related art, so that it is possible to design a high speed semiconductor device without frequency limitation.

Although various embodiments have been described for illustrative purposes, it will be apparent to those skilled in the art that various changes and modifications may be made without departing from the spirit and scope of the invention as defined in the following claims.

What is claimed is:

1. A delay locked loop comprising:
a main delay circuit configured to generate a plurality of initial clocks by delaying an internal clock, the main delay circuit including a plurality of unit delay lines, wherein each of the plurality of unit delay lines includes a respective coarse delay line and a respective fine delay line; and
a plurality of sub-delay lines configured to generate a plurality of phase clocks having a phase difference corresponding to a desired initial delay by respectively delaying the internal clock and the initial clocks,
wherein the phase difference among the phase clocks is adjusted according to delay values of the plurality of sub-delay lines,
wherein the sub-delay lines are set to have delay values depending on a mode, the mode being a high speed mode, a normal mode, or a lower power mode,
wherein in the high speed mode, the plurality of sub-delay lines are set to have delay values that decrease by a predetermined value from N times an initial delay value of the coarse delay line of the main delay circuit in sequence of the phase clocks, where N is an integer,
wherein in the lower power mode, the plurality of sub-delay lines are set to have delay values that increase by a predetermined value from an initial delay value of the coarse delay line of the main delay circuit in sequence of the phase clocks, and
wherein in the normal mode, the plurality of sub-delay lines are set to have an initial delay value of the coarse delay line of the main delay circuit.

2. The delay locked loop of claim 1, wherein the phase difference between the phase clocks is set to be smaller than one cycle of the internal clock divided by the number of the phase clocks by adjusting the delay values of the plurality of sub-delay lines.

3. The delay locked loop of claim 1, wherein the delay values of the plurality of sub-delay lines are adjusted according to a target value of the initial delay.

4. The delay locked loop of claim 1, wherein the plurality of unit delay lines are serially connected to one another, the plurality of unit delay lines providing a same delay value,
wherein the initial clocks are respectively produced by the plurality of unit delay lines.

5. A delay locked loop comprising:
a main delay circuit configured to generate first, second, third, and fourth initial clocks by delaying an internal clock, the main delay circuit including first, second, third, and fourth unit delay lines, wherein each of the first, second, third, and fourth unit delay lines includes a respective coarse delay line and a respective fine delay line; and
a sub-delay circuit configured to generate first, second, third, and fourth phase clocks having a phase difference according to a desired initial delay by respectively delaying the internal clock and the first to third initial clocks by first, second, third, and fourth delay values,
wherein the first to fourth delay values are used to adjust the phase difference according to the initial delay,
wherein the delay values of the first to fourth sub-delay lines are set depending on a mode, the mode being a high speed mode, a normal mode, or a lower power mode,
wherein in the high speed mode, the first to fourth sub-delay lines are set to have delay values that decrease by a predetermined value from N times an initial delay value of the coarse delay line of the main delay circuit in sequence of the phase clocks, where N is an integer,
wherein in the lower power mode, the first to fourth sub-delay lines are set to have delay values that increase by a predetermined value from an initial delay value of the coarse delay line of the main delay circuit in sequence of the phase clocks, and
wherein in the normal mode, the first to fourth sub-delay lines are set to have an initial delay value of the coarse delay line of the main delay circuit.

6. The delay locked loop of claim 5, wherein the sub-delay circuit comprises:
a first sub-delay line configured to generate the first phase clock by delaying the internal clock by the first delay value;
a second sub-delay line configured to generate the second phase clock by delaying the first initial clock by the second delay value;
a third sub-delay line configured to generate the third phase clock by delaying the second initial clock by the third delay value; and
a fourth sub-delay line configured to generate the fourth phase clock by delaying the third initial clock by the fourth delay value.

7. The delay locked loop of claim 5, wherein the first delay value is greater than the second delay value, the second delay value is greater than the third delay value, and third delay value is greater than the fourth delay value in the high speed mode.

8. The delay locked loop of claim 5, wherein the phase difference among the first, second, third, and fourth phase clocks is set to be smaller than one cycle of the internal clock divided by the number of the phase clocks by adjusting the delay values of the first to fourth sub-delay lines.

9. The delay locked loop of claim 5, wherein the first, second, third, and fourth unit delay lines are serially connected to one another, the first to fourth unit delay lines providing respective delays equal to a same delay value in response to a control signal,
wherein the first, second, third, and fourth initial clocks are respectively produced by the first, second, third, and fourth unit delay lines.

* * * * *